United States Patent
Dong

(10) Patent No.: US 9,891,489 B2
(45) Date of Patent: *Feb. 13, 2018

(54) ARRAY SUBSTRATE AND LIQUID CRYSTAL DISPLAY

(71) Applicant: Shenzhen China Star Optoelectronics Technology Co., Ltd., Shenzhen, Guangdong (CN)

(72) Inventor: Chengcai Dong, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 1172 days.

This patent is subject to a terminal disclaimer.

(21) Appl. No.: 14/006,104

(22) PCT Filed: Aug. 19, 2013

(86) PCT No.: PCT/CN2013/081717
§ 371 (c)(1),
(2) Date: Sep. 18, 2013

(87) PCT Pub. No.: WO2015/021660
PCT Pub. Date: Feb. 19, 2015

(65) Prior Publication Data
US 2015/0138471 A1 May 21, 2015

(30) Foreign Application Priority Data
Aug. 15, 2013 (CN) .......................... 2013 1 3567777

(51) Int. Cl.
G02F 1/1362 (2006.01)
G09G 3/36 (2006.01)
(Continued)

(52) U.S. Cl.
CPC ...... *G02F 1/13624* (2013.01); *G02F 1/13306* (2013.01); *G02F 1/136213* (2013.01);
(Continued)

(58) Field of Classification Search
CPC .. G09G 3/3648; G09G 3/3659; G09G 3/3677; G09G 2300/0447;
(Continued)

(56) References Cited

U.S. PATENT DOCUMENTS

2007/0153146 A1* 7/2007 Shih .................. G02F 1/136213
349/42
2009/0027581 A1* 1/2009 You .................... G02F 1/13624
349/48
(Continued)

*Primary Examiner* — Sanjiv D Patel
(74) *Attorney, Agent, or Firm* — Andrew C. Cheng

(57) ABSTRACT

An array substrate including a plurality of pixel cells, at least one common electrode line, at least one data line, and at least one first scanning line and second scanning line parallel to the first scanning line is disclosed. The first scanning line and the second scanning line intersect with the data line. The pixel cell includes a first pixel electrode, a second pixel electrode, a first transistor, a second transistor, a third transistor, and a control circuit. In addition, a liquid crystal display is also disclosed. By adding one control circuit, the color shift effect in wide viewing angle is enhanced and the image sticking is eliminated.

11 Claims, 3 Drawing Sheets

(51) Int. Cl.
 *G02F 1/133* (2006.01)
 *H01L 27/12* (2006.01)
(52) U.S. Cl.
 CPC ......... *G09G 3/3607* (2013.01); *G09G 3/3614* (2013.01); *G09G 3/3659* (2013.01); *H01L 27/124* (2013.01); *G09G 3/3677* (2013.01); *G09G 2320/0257* (2013.01)
(58) Field of Classification Search
 CPC ..... G09G 2330/023; G09G 2310/0251; G09G 3/3614; G09G 2300/0823; G02F 1/136213; G02F 1/13624; G02F 1/1368; G02F 1/1362; G02F 1/136277; G02F 2201/40
 See application file for complete search history.

(56) References Cited

U.S. PATENT DOCUMENTS

| | | | |
|---|---|---|---|
| 2010/0220116 A1* | 9/2010 | Liao | G09G 3/3659 345/690 |
| 2012/0033148 A1* | 2/2012 | Yang | G02F 1/134309 349/39 |
| 2012/0044434 A1* | 2/2012 | Yoon | G09G 3/3659 349/38 |
| 2013/0249882 A1* | 9/2013 | Lin | G09G 3/3648 345/212 |

* cited by examiner

ARRAY SUBSTRATE AND LIQUID CRYSTAL DISPLAY

BACKGROUND OF THE INVENTION

1. Field of the Invention

The present disclosure relates to display technology, and more particularly to an array substrate and a liquid crystal display.

2. Discussion of the Related Art

TFT-LCDs include array substrates with a plurality of pixel areas respectively corresponding to R, G, and B arranged thereon. In addition, TFT-LCDs also include scanning lines, data lines, TFT for controlling the pixel areas and storage capacitors and liquid crystal capacitors.

Currently, color shift often occurs in wide viewing angle for Vertical Alignment (VA) large-scale LCDs.

In order to overcome this problem, one general solution is to divide one pixel area to a main-area A and a sub-area B, and light beams are not able to pass through the location between the main-area A and the sub-area B. When the grayscale values of video signals are the same, the voltages applied to the two areas are different to obtain different γ curves. The difference of the visual effect of the γ curve formed by the two areas between a wide-viewing-angle-view and a narrow-viewing-angle-view is reduced, which greatly enhanced the color shift issue in wide viewing angle.

FIG. 1 is a schematic view of the charging sharing 08 (CS) circuit of the array substrate of one conventional TFT-LCD. Referring to FIG. 1, each pixel areas includes a data line 110, a first scanning line 120, a second scanning line 130, a first pixel electrode 140, a second pixel electrode 150, a first thin film transistor (TFT_A), a second thin film transistor (TFT_B), and a third thin film transistor (TFT_C). The data line 110 connects to the source of the TFT_A and the TFT_B. The first pixel electrode 140 connects to the drain of the TFT_A. The second pixel electrode 150 connects to the drain of the TFT_B. The second scanning line 130 connects to the gate of the TFT_C to provide scanning signals. The drain of the TFT_C connects to the second pixel electrode 150. The source of the TFT_C connects to the common electrode via the first capacitor (Cs1).

The TFT-LCD is driven in a row-by-row manner. When the n-th row is scanned, the signals (Vgn) of the first scanning line 120 is at a high level and the signals (Vgn+1) of the second scanning line 130 is at a low level. The TFT_A and TFT_B are turn on and the TFT_C is turn off. The data line 110 charges the first storage capacitor (Cst_A) and the first liquid crystal capacitor (Clc_A) connected with the first pixel electrode 140 and the second storage capacitor (Cst_B) and the second liquid crystal capacitor (Clc_B). The pixel voltage (VA) of the first pixel electrode 140 and the pixel voltage (VB) of the second pixel electrode 150 are charged until being equal to the voltage (Vd) of the data line 110. When the (n+1)-th row is scanned, the signals (Vgn) of the first scanning line 120 is switched to the low level, and the signals (Vgn+1) of the second scanning line 130 is switched to the high level. The TFT_A and the TFT_B are turn off, and the TFT_C is turn on. The pixel voltage (VB) of the second pixel electrode 150 discharges toward the common electrode via the first capacitor Cs1 to change the pixel voltage (VB) of the second pixel electrode 150. As such, the pixel voltage (VA) of the first pixel electrode 140 is different from the pixel voltage (VB) of the second pixel electrode 150, which achieves the low color shift (LCS) effect. Assuming that the VA and the VB respectively represents the pixel voltage of the "A area" and the "B area," the ratio of VB to VA can be shown by the equation of:

$$VB/VA=(Cst\_B+Clc\_B)/(Cst\_B+Clc\_B+2Cs1)$$

The ratio of VB/VA is a key factor, wherein the capacitor (Cs1) plays an important role of determining the value of the ratio of VB to VA.

FIG. 2 is a schematic view of the capacitor (Cs1) of FIG. 1. Referring to FIG. 2, the capacitor (Cs1) includes a first metallic layer (M1), an insulation layer (SiNx), a semiconductor layer (a-si) and a second metallic layer (M2). The first metallic layer (M1) and the second metallic layer (M2) correspond to a gate metallic layer and a source metallic layer of the array substrate. That is, the metallic gate of the TFT is formed by sputtering a gate metallic layer on the array substrate, and then the first metallic layer (M1) is formed by etching the gate metallic layer. The metallic source of the TFT is formed by sputtering a source metallic layer on the array substrate, and then the second metallic layer (M2) is formed by etching the source metallic layer. The insulation layer (SiNx) corresponds to the gate insulation layer on the array substrate. The array substrate corresponds to the TFT semiconductor layer on the array substrate. That is, the TFT semiconductor layer is formed on the array substrate, and the lithographic process is applied to form the TFT semiconductor layer. In addition, the lithographic process is applied to form the semiconductor layer (AS) of the capacitor. Generally, the second metallic layer (M2) connects to the voltage of the pixel electrode, and the first metallic layer (M1) connects to the lines of the common electrode.

FIG. 3 is a curve diagram of the capacitor-voltage (C-V) of the capacitor (Cs1). As shown, the capacitance of the positive half cycle is larger than that of the negative half cycle. The positive half cycle relates to one period during which the voltage of the pixel electrode, i.e., VB or VA, is larger than that of the Vcom, and the negative half cycle relates to one period during which the voltage of the pixel electrode is smaller than that of the Vcom. For each pixel areas, the positive half cycle and the negative half cycle are interleaved so as to drive the TFT-LCD. Preferably, the VB/VA ratios of the positive and negative half cycle remain the same. However, the capacitance of the positive half cycle is generally larger than or smaller than that of the negative half cycle such that the VB/VA ratio of the positive half cycle is smaller.

Therefore, the color shift circuit, such as CS08, may results in asymmetric positive half cycle and negative half cycle due to the different VB/VA ratios. In addition to the affected color shift effect, the color shift circuit may result in image sticking.

SUMMARY

The object of the invention is to provide an array substrate and a liquid crystal display to compensate the different voltage ratios of positive half cycle and negative half cycle of two sub-areas. In this way, the color shift effect in wide viewing angle is enhanced, and the image sticking is eliminated.

In one aspect, an array substrate includes: a plurality of pixel cells, at least one common electrode line, at least one data line, at least one first scanning line and second scanning line parallel to the first scanning line, and the first scanning line and the second scanning line intersect with the data line; the corresponding second scanning line of a current pixel cell is the same with the corresponding first scanning line of a next pixel cell; the pixel cell includes a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor includes one control end, a first end, and a second end, the second scanning line connects to the control end of the third transistor to provide the scanning signals to the third transistor, and the second pixel electrode connects to the first end of the third transistor; the control circuit includes a first capacitor and a second capacitor, the structure of the first capacitor is the same with the structure of the second capacitor, both of the first capacitor and the second capacitor includes a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

Wherein the first transistor, the second transistor, and the third transistor are respectively a first thin film transistor (TFT), a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

Wherein the first transistor, the second transistor, and the third transistor are respectively a first Darlington transistor or a first triode, a second Darlington transistor or a second triode, and a third Darlington transistor or a third triode, the control end, the input end, and the output end of the first transistor respectively corresponds to a base, a collector, and an emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

In another aspect, an array substrate includes: a plurality of pixel cells, at least one common electrode line, at least one data line, at least one first scanning line and second scanning line parallel to the first scanning line, and the first scanning line and the second scanning line intersect with the data line; the pixel cell includes a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor includes one control end, a first end, and a second end, the second scanning line connects to the control end of the third transistor to provide the scanning signals to the third transistor, the second pixel electrode connects to the first end of the third transistor, and the control circuit connects to the second end of the third transistor; and wherein when the positive polarity and the negative polarity are reversed, the control circuit operates on the second pixel electrode when the third transistor is turn on so as to change a voltage of the second positive half cycle, and a value of effective capacitance of the control circuit when the positive polarity is inversed is equal to the value of effective capacitance of the control circuit when the negative polarity is inversed such that a ratio of the voltage difference between the second pixel electrode and the common electrode line to the voltage difference between the first pixel electrode and the common electrode line when the positive polarity is inversed is the same with the ratio of the voltage difference between the second pixel electrode and the common electrode line to the voltage difference between the first pixel electrode and the common electrode line when the negative polarity is inversed.

Wherein the control circuit includes a first capacitor and a second capacitor, the structure of the first capacitor is the same with the structure of the second capacitor, both of the first capacitor and the second capacitor includes a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

Wherein the first transistor, the second transistor, and the third transistor are respectively a first TFT, a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

Wherein the first transistor, the second transistor, and the third transistor are respectively a first Darlington transistor or a first triode, second Darlington transistor or a second triode, a third Darlington transistor or a third triode, the control end, the input end, and the output end of the first transistor respectively corresponds to the base, the collector, and the emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

Wherein the corresponding second scanning line of a current pixel cell is the same with the corresponding first scanning line of a next pixel cell.

In another aspect, a liquid crystal display comprising a first substrate, a second substrate opposite to the first substrate, and a liquid crystal layer between the first substrate and the second substrate. The second substrate includes: a plurality of pixel cells, at least one common electrode line, at least one data line, at least one first scanning line and second scanning line parallel to the first scanning line, and the first scanning line and the second scanning line intersect with the data line; the pixel cell includes a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor includes one control end, a first end, and a second end, the second scanning line connects to the control end of the third transistor to provide the scanning signals to the third transistor, the second pixel electrode connects to the first end of the third transistor, and the control circuit connects to the second end of the third transistor; and wherein when the positive polarity and the negative polarity are reversed, the control circuit operates on the second pixel electrode when the third transistor is turn on so as to change a voltage of the second positive half cycle, and a value of effective capacitance of the control circuit when the positive polarity is inversed is equal to the value of effective capacitance of the control circuit when the negative polarity is inversed such that a ratio of the voltage difference between the second pixel electrode and the common electrode line to the voltage difference between the first pixel electrode and the common electrode line when the positive polarity is inversed is the same with the ratio of the voltage difference between the second pixel electrode and the common electrode line to the voltage difference between the first pixel electrode and the common electrode line when the negative polarity is inversed.

Wherein the control circuit includes a first capacitor and a second capacitor, the structure of the first capacitor is the same with the structure of the second capacitor, both of the first capacitor and the second capacitor includes a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

Wherein the first transistor, the second transistor, and the third transistor are respectively a first TFT, a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

Wherein the first transistor, the second transistor, and the third transistor are respectively a first Darlington transistor or a first triode, second Darlington transistor or a second triode, a third Darlington transistor or a third triode, the control end, the input end, and the output end of the first transistor respectively corresponds to the base, the collector, and the emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

Wherein the corresponding second scanning line of a current pixel cell is the same with the corresponding first scanning line of a next pixel cell.

In view of the above, by adding one control circuit, the voltage ratios of the first pixel electrode and the second pixel electrode remain the same such that the color shift effect in wide viewing angle is enhanced and the image sticking is eliminated.

DETAILED DESCRIPTION OF THE EMBODIMENTS

Embodiments of the invention will now be described more fully hereinafter with reference to the accompanying drawings, in which embodiments of the invention are shown.

In one embodiment, one array substrate and the liquid crystal display with the same are disclosed. The array substrate includes a plurality of pixel cells.

Figure 1:
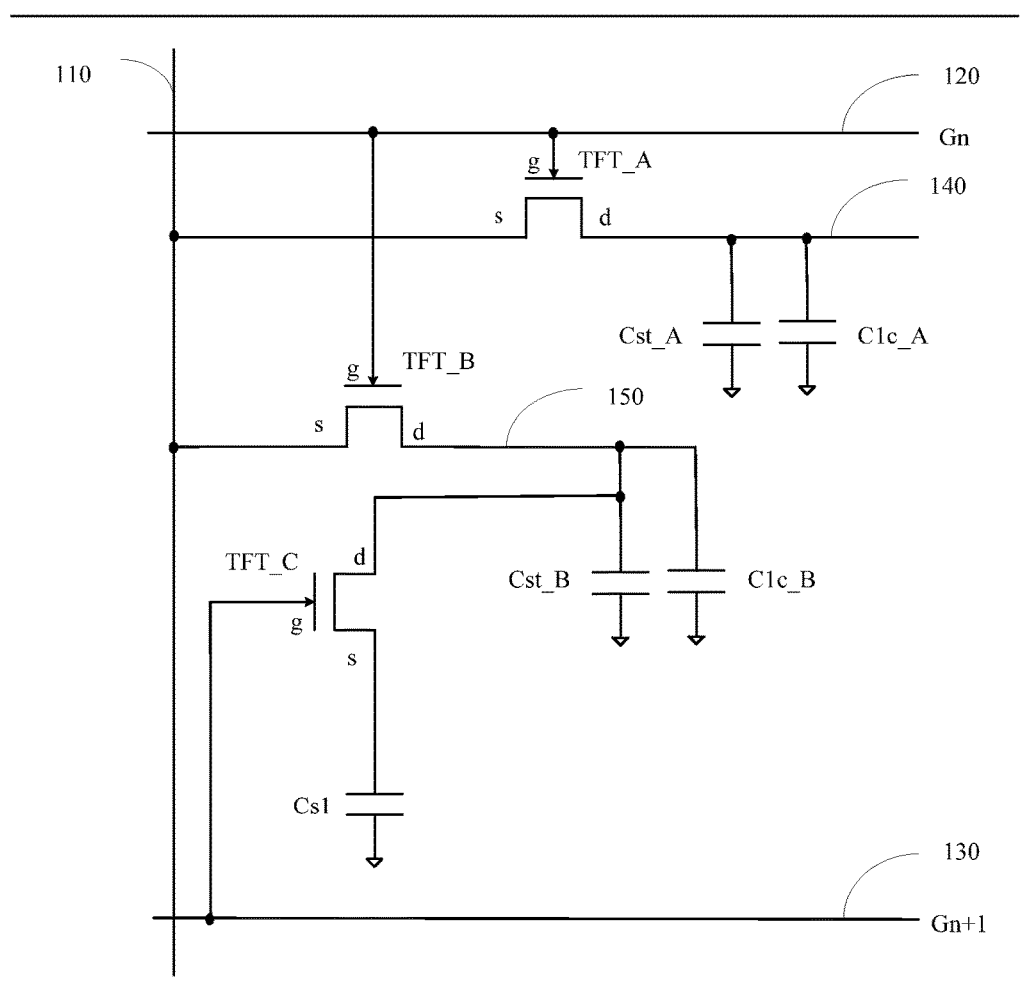
FIG. 1 is a schematic view of the charging sharing circuit of the array substrate of one conventional TFT-LCD.
Figure 2:
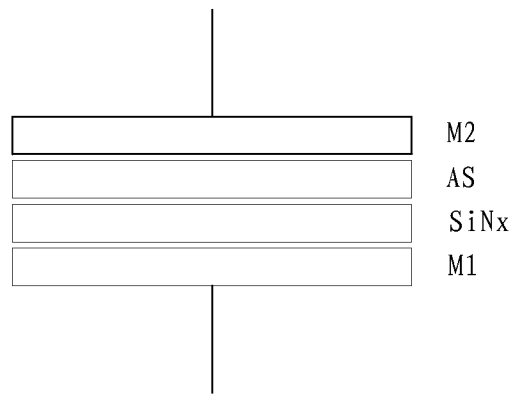
FIG. 2 is a schematic view of the capacitor (Cs1) of FIG. 1.
Figure 3:
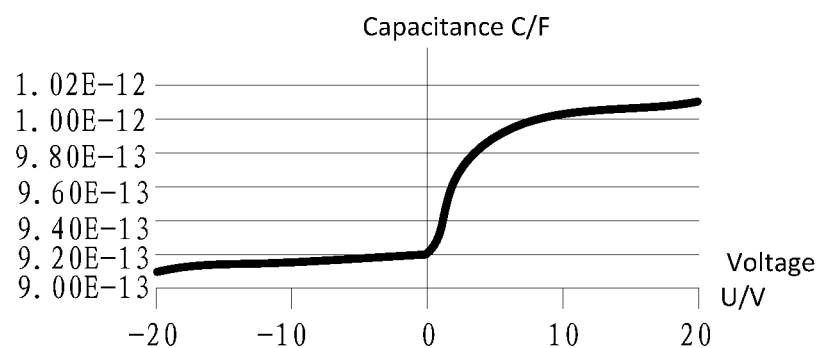
FIG. 3 is a curve diagram of the capacitor-voltage (C-V) of the capacitor (Cs1).
Figure 4:
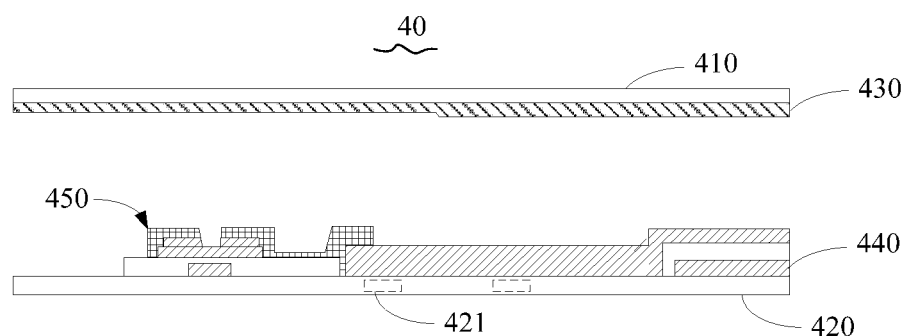
FIG. 4 is a schematic view of the liquid crystal display in accordance with one embodiment.

FIG. 4 is a schematic view of the liquid crystal display in accordance with one embodiment. The liquid crystal display 40 includes a first substrate 410, a second substrate 420 opposite to the first substrate 410, and a liquid crystal layer (not shown) between the first substrate 410 and the second substrate 420. The first substrate 410 is a color filter (CF) substrate having a common electrode 430. The second substrate 420 is a thin film transistor (TFT) array substrate.

Figure 5:
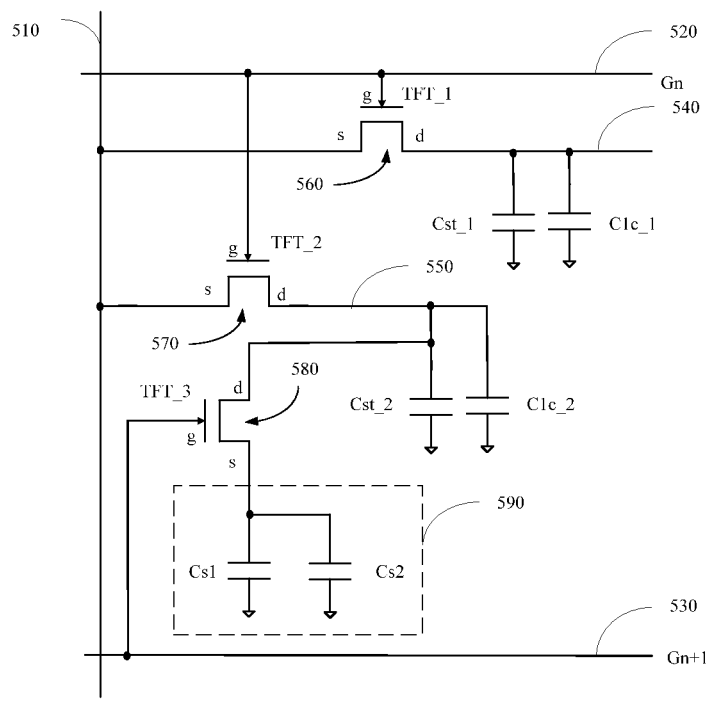
FIG. 5 is an equivalent circuit of the pixel electrode of FIG. 4.

FIG. 5 is an equivalent circuit of the pixel electrode of FIG. 4. FIGS. 4 and 5 show one pixel cell as an example. In the embodiment, the TFT array substrate 420 of the liquid crystal display 40 includes a pixel cell 421, a common electrode line 440, a data line 510, and a first scanning line 520 and a second scanning line 530 parallel to the first scanning line 520. The first scanning line 520 and the second scanning line 530 intersect with the data line 510.

The pixel cell 421 includes a first pixel electrode 540, a second pixel electrode 550, a first transistor 560, a second transistor 570, a third transistor 580, and a control circuit 590. Both of the first transistor 560 and the second transistor 570 include one control end, one input end, and one output end.

The first scanning line 520 connects to the control ends of the first transistor 560 and the second transistor 570 to provide scanning signals. The data line 510 connects to the input ends of the first transistor 560 and the second transistor 570. The first pixel electrode 540 connects to the output end of the first transistor 560. In addition, the first pixel electrode 540 connects to a first storage capacitor (Cst_1) and a first liquid crystal capacitor (Clc_1) connected in parallel. The pixel electrode 550 connects to the output end of the second transistor 570. In addition, the second pixel electrode 550 connects to the second storage capacitor (Cst_2) and the second liquid crystal capacitor (Clc_2) connected in parallel. The first liquid crystal capacitor (Clc_1) is the equivalent capacitance formed by the liquid crystal between the first pixel electrode 540 and the common electrode 430 of the first substrate 410. The second liquid crystal capacitor (Clc_2) is the equivalent capacitance formed by the liquid crystal between the second pixel electrode 550 and the common electrode 430 of the first substrate 410. The first storage capacitor (Cst_1) is formed by the first pixel electrode 540 and the common electrode line 440 of the TFT array substrate 420. The second storage capacitor (Cst_2) is formed by the second pixel electrode 550 and the common electrode line 440 of the TFT array substrate 420.

The third transistor 580 includes one control end, one first end, and one second end. The second scanning line 530 connects to the control end of the third transistor 580 to provide the scanning signals. The first end of the third transistor 580 connects to the second pixel electrode 550. The second end of the third transistor 580 connects to the control circuit 590.

Figure 6:
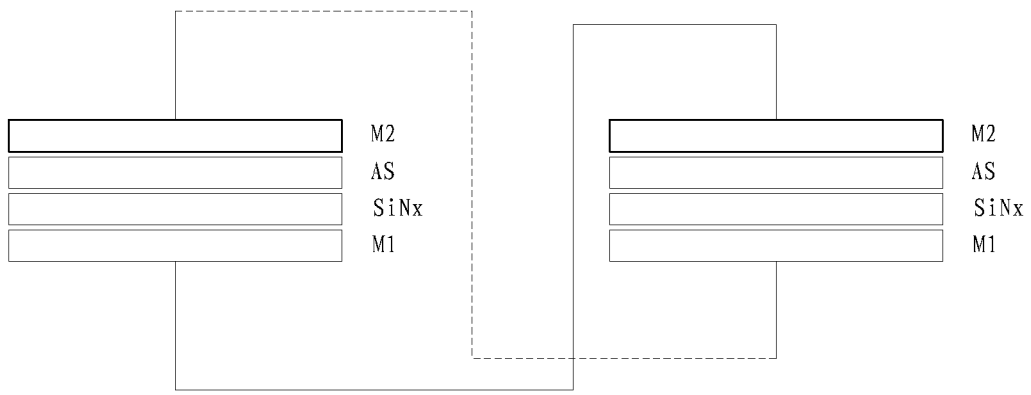
FIG. 6 is a schematic view of the control circuit of FIG. 5.

FIG. 6 is a schematic view of the control circuit of FIG. 5. The control circuit 590 includes a first capacitor (Cs1) and a second capacitor (Cs2). The structure of the first capacitor (Cs1) is similar to that of the second capacitor (Cs2). The first capacitor (Cs1), also the second capacitor (Cs2), include a first metallic layer (M1), an insulation layer (SiNx), a semiconductor layer (AS), and a second metallic layer (M2) arranged in turn. The second metallic layer (M2) of the first capacitor (Cs1) and the first metallic layer (M1) of the second capacitor (Cs2) connect to the second end of the third transistor 580. The first metallic layer (M1) of the first capacitor (Cs1) and the second metallic layer (M2) of the second capacitor (Cs2) connect to the common electrode line 440 of the TFT array substrate 420. The first metallic layer (M1) and the second metallic layer (M2) correspond to the gate metallic layer and the source metallic layer of the array substrate. That is, the metallic gate of the TFT is formed by sputtering the gate metallic layer on the array substrate, and then the first metallic layer (M1) is formed by etching the gate metallic layer. The metallic source of the TFT is formed by sputtering the source metallic layer on the array substrate, and then the second metallic layer (M2) is formed by etching the source metallic layer. The insulation layer (SiNx) corresponds to the gate insulation layer of the array substrate. The semiconductor layer (AS) corresponds to the TFT semiconductor layer of the array substrate. That is, the TFT semiconductor layer is formed on the array substrate by applying the lithographic process. In addition, the semiconductor layer (AS) of the capacitor is also formed by the lithographic process.

When the positive polarity and the negative polarity are inversed, the control circuit 590 operates on the second pixel electrode 550 when the third transistor 580 is turn on so as to change the voltage of the second pixel electrode 550. In addition, the effective capacitance of the control circuit 590 remain the same when the positive polarity or the negative polarity is inversed such that ratio of the voltage difference between the second pixel electrode 550 and the common electrode line 440 to the voltage difference between the first pixel electrode 540 and the common electrode line 440 is the same with the ratio of the voltage difference between the second pixel electrode 550 and the common electrode line 440 to the voltage difference between the first pixel electrode 540 and the common electrode line 440.

Referring to FIG. 5, the first transistor 560, the second transistor 570, and the third transistor 580 are respectively a first TFT, a second TFT, and a third TFT. The control end, input end, and output end of the first transistor 560 respectively corresponds to a gate, a source and a drain of the first TFT. The control end, the input end, and the output end of the second transistor 570 are respectively corresponds to the gate, the source, and the drain of the second TFT. The control end, the input end, and the output end of the third transistor 580 are respectively corresponds to the gate, the source, and the drain of the third TFT.

The TFT-LCD is driven in a row-by-row manner. When the n-th row is scanned, the signals (Vgn) of the first scanning line 520 is at the high level, and the signals (Vgn+1) of the second scanning line 530 is at the low level. The first transistor 560 and the second transistor 570 are turn on, and the third transistor 580 is turn off. The data line 510 charges to the first storage capacitor (Cst_1) and the first liquid crystal capacitor (Clc_1) that are connected in parallel, and the data line 510 charges to the second storage capacitor (Cst_2) and the second liquid crystal capacitor (Clc_2) connected in parallel such that the voltage of the first pixel electrode 540 and the second pixel electrode 550 are the same. When the (n+1)-th row is scanned, the signals (Vgn+1) of the second scanning line 530 is at the high level, and the signals (Vgn) of the first scanning line 520 is at the high level. At this moment, the first transistor 560 and the second transistor 570 are turn off, and the third transistor 580 is turn on. As the voltage of the second pixel electrode 550 is different from that of the common electrode line 440, the second pixel electrode 550 discharges the common electrode line 440 via the first capacitor (Cs1) and the second capacitor (Cs2). As such, the voltage of the second pixel electrode 550 is changed. When the third transistor 580 is turn on, when the positive polarity is inversed, the voltage of the second pixel electrode 550 is larger than that of the common electrode line 440. The first capacitor (Cs1) is in the positive life cycle, and the second capacitor (Cs2) is in the negative life cycle. The capacitance of the first capacitor (Cs1) is larger than the capacitance of the second capacitor (Cs2). The voltage of the second pixel electrode 550 is decreased via the first capacitor (Cs1) and the second capacitor (Cs2). When the negative polarity is inversed, the voltage of the second pixel electrode 550 is smaller than that of the common electrode line 440. The first capacitor (Cs1) is in the negative half cycle, and the second capacitor (Cs2) is in the positive half cycle. The capacitance of the first capacitor (Cs1) is smaller than the capacitance of the second capacitor (Cs2). The voltage of the second pixel electrode 550 is increased via the first capacitor (Cs1) and the second capacitor (Cs2). As the structure and capacitance of the first capacitor (Cs1) and the second capacitor (Cs2) are the same, the sum of the capacitance of the first capacitor (Cs1) and the second capacitor (Cs2) remains the same when the positive polarity and the negative polarity are inversed. That is, the effective capacitance of the control circuit 590 when the positive polarity is inversed is equal to the effective capacitance of the control circuit 590 when the negative polarity is inversed. As such, the ratio of the voltage difference between the second pixel electrode 550 and the common electrode line 440 to the voltage difference between the first pixel electrode 540 and the common electrode line 440 when the positive polarity is inversed, is the same with the ratio of the voltage difference between the second pixel electrode 550 and the common electrode line 440 to the voltage difference between the first pixel electrode 540 and the common electrode line 440 when the negative polarity is inversed.

When the (n+2)-th row is scanned, the signals (Vgn+1) of the second scanning line 530 is at the low level. The third transistor 580 is turn off. The second pixel electrode 550 stops charging the common electrode line 440 via the first capacitor (Cs1) and the second capacitor (Cs2). The voltage of the second pixel electrode 550 remains until the next frame. At this moment, the corresponding second scanning line 530 of the pixel cell 421 is the same with the corresponding first scanning line of the next pixel cell.

It is to be noted that the common electrode line 440 of the TFT array substrate 420 has not to be connected with the common electrode 430 of the first substrate 410. In one embodiment, the voltage can be supplied by two different power sources, but the two voltage are the same. Preferably, the voltage supplied to the common electrode 430 and the common electrode line 440 is larger than 5V and smaller than 7V, and the voltage supplied to the first scanning line 520 and the second scanning line 530 is larger than 20V and smaller than 30V.

In one embodiment, the first transistor 560, the second transistor 570, and the third transistor 580 are TFTs. In other embodiments, the first transistor 560, the second transistor 570, and the third transistor 580 are triode, Darlington transistors, or other transistors. The control end, the input end, and the output end of the first transistor 560 respectively corresponds to the base, the collector, and the emitter of the first Darlington transistor or triode. The control end, the input end, and the output end of the second transistor 570 respectively corresponds to the base, the collector, and the emitter of the second Darlington transistor or triode. The control end, the input end, and the output end of the third transistor 580 respectively corresponds to the base, the collector, and the emitter of the third Darlington transistor or triode.

In one embodiment, the control circuit 590 includes the first capacitor (Cs1) and the corresponds. In other embodiments, the control circuit 590 includes two or a plurality of capacitors with the same structure, connection, capacitance with the first capacitors (Cs1) and second capacitors (Cs2) so as to ensure that the effective capacitance of the control circuit 590 remains the same when the positive polarity or the negative polarity is inversed.

FIG. 5 is an equivalent circuit of the pixel electrode of FIG. 4. The pixel electrode includes the first pixel electrode 540, the second pixel electrode 550, the first transistor 560, the second transistor 570, the third transistor 580, and the control circuit 590. Both of the first transistor 560 and the second transistor 570 include the control end, the input end, and the output end.

In view of the above, by adding one control circuit, the voltage ratios of the first pixel electrode and the second pixel electrode remain the same such that the color shift effect in wide viewing angle is enhanced and the image sticking is eliminated.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An array substrate, comprising:
 a plurality of pixel cells, at least one common electrode line, at least one data line, at least one first scanning line and second scanning line parallel to the first scanning line, and the first scanning line and the second scanning line intersect with the data line;

the corresponding second scanning line of a current pixel cell is the same with the corresponding first scanning line of a next pixel cell;

the pixel cell comprises a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor comprises one control end, a first end, and a second end, the second scanning line connects to the control end of the third transistor to provide the scanning signals to the third transistor, and the second pixel electrode connects to the first end of the third transistor;

the control circuit comprises a first capacitor and a second capacitor, the structure of the first capacitor is the same with the structure of the second capacitor, both of the first capacitor and the second capacitor comprises a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

2. The array substrate as claimed in claim 1, wherein the first transistor, the second transistor, and the third transistor are respectively a first thin film transistor (TFT), a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

3. The array substrate as claimed in claim 1, wherein the first transistor, the second transistor, and the third transistor are respectively a first Darlington transistor or a first triode, a second Darlington transistor or a second triode, and a third Darlington transistor or a third triode, the control end, the input end, and the output end of the first transistor respectively corresponds to a base, a collector, and an emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

4. An array substrate, comprising:

a plurality of pixel cells, at least one common electrode line, at least one data line, at least one first scanning line and second scanning line parallel to the first scanning line, and the first scanning line and the second scanning line intersect with the data line;

the pixel cell comprises a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor comprises one control end, a first end, and a second end, the second scanning line connects to the control end of the third transistor to provide the scanning signals to the third transistor, the second pixel electrode connects to the first end of the third transistor, and the control circuit connects to the second end of the third transistor; and wherein when the positive polarity and the negative polarity are reversed, the control circuit operates on the second pixel electrode when the third transistor is turn on so as to change a voltage of the second positive half cycle, and a value of effective capacitance of the control circuit when the positive polarity is inversed is equal to the value of effective capacitance of the control circuit when the negative polarity is inversed such that a ratio of the voltage difference between the second pixel electrode and the common electrode line to the voltage difference between the first pixel electrode and the common electrode line when the positive polarity is inversed is the same with the ratio of the voltage difference between the second pixel electrode and the common electrode line to the voltage difference between the first pixel electrode and the common electrode line when the negative polarity is inversed;

wherein the control circuit comprises a first capacitor and a second capacitor, the structure of the first capacitor is the same with the structure of the second apacitor, both of the first capacitor and the second capacitor comprises a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

5. The array substrate as claimed in claim 4, wherein the first transistor, the second transistor, and the third transistor are respectively a first TFT, a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

6. The array substrate as claimed in claim 4, wherein the first transistor, the second transistor, and the third transistor are respectively a first Darlington transistor or a first triode, second Darlington transistor or a second triode, a third Darlington transistor or a third triode, the control end, the input end, and the output end of the first transistor respectively corresponds to the base, the collector, and the emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

7. The array substrate as claimed in claim 4, wherein the corresponding second scanning line of a current pixel cell is the same with the corresponding first scanning line of a next pixel cell.

8. A liquid crystal display comprising a first substrate, a second substrate opposite to the first substrate, and a liquid crystal layer between the first substrate and the second substrate, characterized in that the second substrate comprising:

a plurality of pixel cells, at least one common electrode line, at least one data line, at least one first scanning line and second scanning line parallel to the first scanning line, and the first scanning line and the second scanning line intersect with the data line;

the pixel cell comprises a first pixel electrode, a second pixel electrode, a first transistor, a second transistor, a third transistor, and a control circuit, both of the first transistor and the second transistor comprise a control end, an input end, and an output end, the first scanning line connects to the control ends of the first transistor and the second transistor to provide scanning signals, the data line connects to the input ends of the first transistor and the second transistor, the first pixel electrode connects to the output end of the first transistor, the second pixel electrode connects to the output end of the second transistor, the third transistor comprises one control end, a first end, and a second end, the second scanning line connects to the control end of the third transistor to provide the scanning signals to the third transistor, the second pixel electrode connects to the first end of the third transistor, and the control circuit connects to the second end of the third transistor; and wherein when the positive polarity and the negative polarity are reversed, the control circuit operates on the second pixel electrode when the third transistor is turn on so as to change a voltage of the second positive half cycle, and a value of effective capacitance of the control circuit when the positive polarity is inversed is equal to the value of effective capacitance of the control circuit when the negative polarity is inversed such that a ratio of the voltage difference between the second pixel electrode and the common electrode line to the voltage difference between the first pixel electrode and the common electrode line when the positive polarity is inversed is the same with the ratio of the voltage difference between the second pixel electrode and the common electrode line to the voltage difference between the first pixel electrode and the common electrode line when the negative polarity is inversed;

wherein the control circuit comprises a first capacitor and a second capacitor, the structure of the first capacitor is the same with the structure of the second capacitor, both of the first capacitor and the second capacitor comprises a first metallic layer, an insulation layer, a semiconductor layer, and a second metallic layer arranged in turn, the second metallic layer of the first capacitor and the first metallic layer of the second capacitor connect to the second end of the third transistor, and the first metallic layer of the first capacitor and the second metallic layer of the second capacitor connect to the common electrode line; and when a positive polarity is inversed and when the second scanning line inputs the scanning signals to turn on the third transistor, a voltage of the second pixel electrode is decreased by the first capacitor and the second capacitor, when a negative polarity is inversed and when the second scanning line inputs the scanning signals to turn on the third transistor, the voltage of the second pixel electrode is increased via the first second capacitor and the second capacitor, a capacitance of the first capacitor when the positive polarity is inversed is larger than the capacitance of the first capacitor when the negative polarity is inversed, and the capacitance of the second capacitor when the positive polarity is inversed is smaller than the capacitance of the second capacitor when the negative polarity is inversed such that the a sum of the capacitance of the first capacitor and the second capacitor when the positive polarity is inversed is equal to the sum of the capacitance of the first capacitor and the second capacitor when the negative polarity is inversed, as such a value of effective capacitance of the control circuit when the negative polarity is inversed is equal to the value of effective capacitance of the control circuit when the positive polarity is inversed.

9. The liquid crystal display as claimed in claim 8, wherein the first transistor, the second transistor, and the third transistor are respectively a first TFT, a second TFT, and a third TFT, the control end, input end, and output end of the first transistor respectively corresponds to a gate, a source and a drain of the first TFT, the control end, the input end, and the output end of the second transistor are respectively corresponds to the gate, the source, and the drain of the second TFT, and the control end, the input end, and the output end of the third transistor are respectively corresponds to the gate, the source, and the drain of the third TFT.

10. The liquid crystal display as claimed in claim 8, wherein the first transistor, the second transistor, and the third transistor are respectively a first Darlington transistor or a first triode, second Darlington transistor or a second triode, a third Darlington transistor or a third triode, the control end, the input end, and the output end of the first transistor respectively corresponds to the base, the collector, and the emitter of the first Darlington transistor or the first triode, the control end, the input end, and the output end of the second transistor respectively corresponds to the base, the collector, and the emitter of the second Darlington transistor or the second triode, and the control end, the input end, and the output end of the third transistor respectively corresponds to the base, the collector, and the emitter of the third Darlington transistor or the third triode.

11. The liquid crystal display as claimed in claim 8, wherein the corresponding second scanning line of a current pixel cell is the same with the corresponding first scanning line of a next pixel cell.

* * * * *